United States Patent
Cook

(10) Patent No.: US 6,276,956 B1
(45) Date of Patent: Aug. 21, 2001

(54) DUAL POINT TEST PROBE FOR SURFACE MOUNT TYPE CIRCUIT BOARD CONNECTIONS

(75) Inventor: Terry D. Cook, Sioux Falls, SD (US)

(73) Assignee: Sencore, Inc., SD (US)

( * ) Notice: Subject to any disclaimer, the term of this patent is extended or adjusted under 35 U.S.C. 154(b) by 0 days.

(21) Appl. No.: 09/289,880

(22) Filed: Apr. 12, 1999

(51) Int. Cl.$^7$ .................................................. H01R 11/18
(52) U.S. Cl. ........................ 439/482; 324/72.5; 33/27.02
(58) Field of Search .................................. 439/219, 482, 439/483, 484; 324/72.5, 149, 754, 761; 33/27.02, 27.033

(56) References Cited

U.S. PATENT DOCUMENTS

| | | | |
|---|---|---|---|
| 2,297,999 | * | 10/1942 | Eubanks . |
| 3,265,969 | * | 8/1966 | Catu . |
| 4,132,946 | * | 1/1979 | Holdren et al. ........................ 324/73 |
| 4,183,359 | * | 1/1980 | Husbands ........................ 128/303.13 |
| 4,195,258 | * | 3/1980 | Yen ........................................ 324/73 |
| 4,923,407 | * | 5/1990 | Rice et al. ........................... 439/92 |
| 5,574,359 | * | 11/1996 | Arthur ..................................... 324/72 |
| 5,764,072 | * | 6/1998 | Kister ..................................... 324/754 |
| 5,939,890 | * | 8/1999 | Kohen et al. ........................ 324/754 |

* cited by examiner

Primary Examiner—Brian Sircus
Assistant Examiner—Thanh-Tam Le
(74) Attorney, Agent, or Firm—Patnaude & Videbeck

(57) ABSTRACT

An insulative caliper type pivotal mounting pivotally secures two elongate arms that at their free ends mount a pair of electrically conductive pointed contacts. Electrical conductors connected to the contacts extend through each of the insulative elongate arms and through the elastic pivotal mounting from which they exit as a coaxial cable. On the distal end of the coaxial cable is positioned a quick connect-disconnect jack adapted for mounting onto a complementary jack in an electronic test instrument. The separation between the pointed ends of the contacts is infinitely adjustable by means of a thumb screw having reversed threaded studs extending from the opposed sides of the center thereof into threaded pivotal mountings on each of the elongate arms. The dual point test probe may be infinitely adjusted, maintained in the predetermined separation and may be manually manipulatable by the single hand of a user when testing current, voltage drop, capacitance, inductance or the like between the contact points.

8 Claims, 2 Drawing Sheets

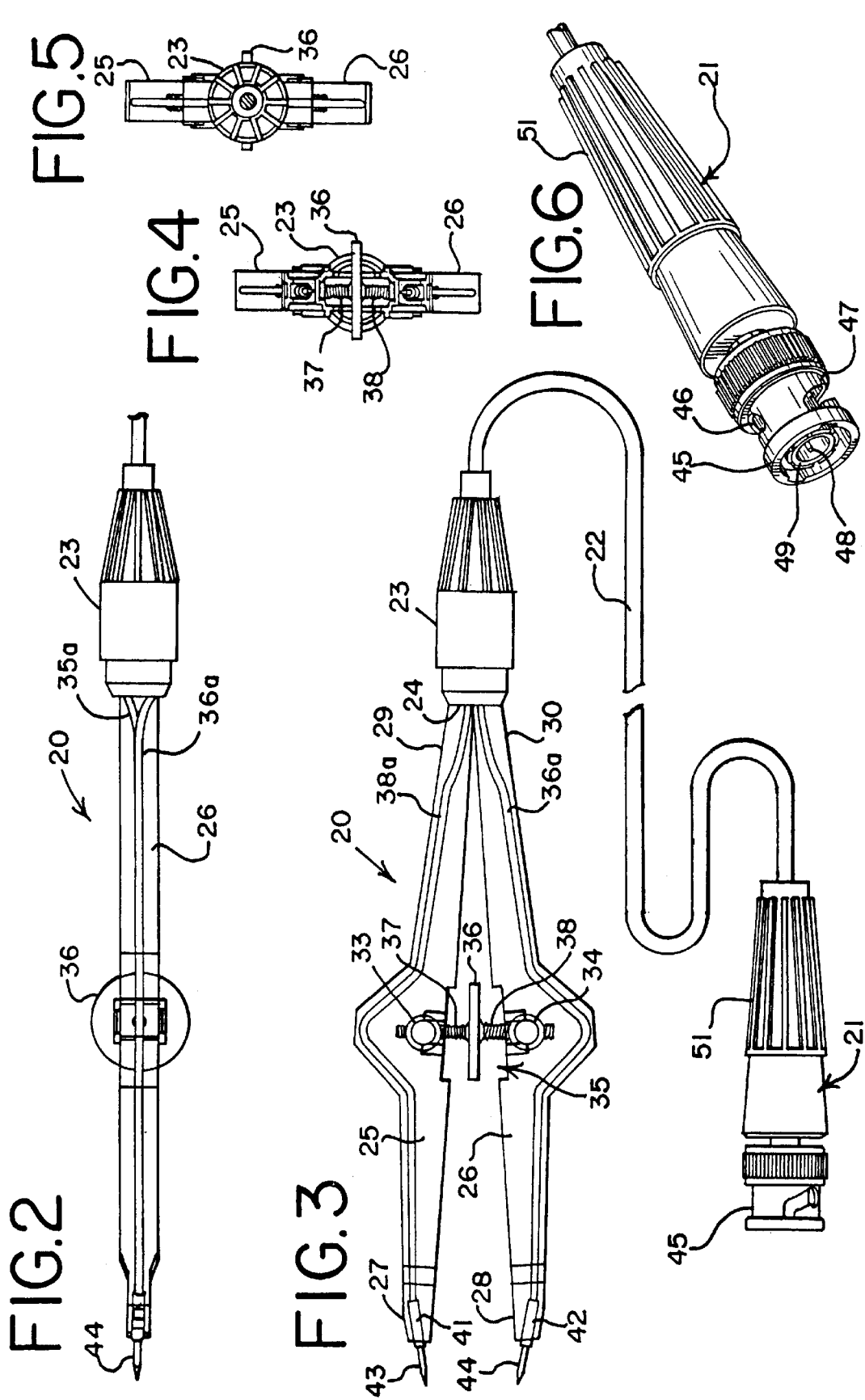

DUAL POINT TEST PROBE FOR SURFACE MOUNT TYPE CIRCUIT BOARD CONNECTIONS

This invention relates generally to test probes for surface mount boards and circuit boards, and more particularly, to a dual point test probe suitable for one handed manual operation when testing components mounted on surface mount boards or electronic circuit boards.

BACKGROUND OF THE INVENTION

Probing components on a printed circuit board becomes increasingly difficult as the miniaturization of electronic components continues and circuit densities increase. Traditional alligator clips have been miniaturized over the years to allow testing of components on miniaturized circuit boards. However, newer surface mount components in many cases do not have any leads on which alligator clips can be connected. Since surface mount components are soldered directly onto the PC board, conventional test clips simply cannot be hooked onto these components. Presently, in order to connect test leads to the surface mounted components, a sharp test probe is placed directly on the solder pad on each side of the component. This normally requires two hands, as a single pointed test lead is held in each hand to make contact with each side of the component or to two measurement points in the circuit. With both hands in use just to hold the test probes, the technician does not have a hand free to make adjustments to the test equipment, press test buttons, etc. Not only that, the technician may not even be able to look at the measurement results on the test equipment because so much attention is required simply to keep the test probes in place on the solder pads. Dual point test probes, such as that shown in U.S. Pat. No. 4,923,407; 4,915,258; and 2,675,528 simply do not have the miniaturization needed to work with surface mount boards, or are not adjustable sufficiently to utilize the close contacts necessary in miniaturized surface mount PC boards. U.S. Pat. No. 3,098,304 discloses a drafting compass that may hold two steel points, however, the entire compass is electrically conductive and made for a differing purpose than applicant's invention.

A need has developed for a new and improved dual point test probe which is manually operated by a single hand of a technician to contact both solder pads of a surface mount electronic component.

SUMMARY OF THE INVENTION

The invention is directed to an adjustable dual point test probe adapted for electrical communication with an electronic test instrument. The test probe includes caliper-like body means including a bight portion and a pair of elongate arms extending from the bight portion in adjustable pivotal relation thereto. The caliper-like body means provides a pair of adjustably separable distal mountings at the free ends of the elongate arms. A pair of pointed electrical contacts are mounted to extend from each of the free ends of the elongate arms. Coaxial cable means including a pair of conductors extend through each of the elongate arms in conductive relation with one of the pointed electrical contacts and extend through those elongate arms and the bight portion of the caliper-like body means and outwardly thereof to terminate in a two wire jack-type connector. The invention further includes means on the caliper-like body means for infinitely adjusting the separation between the pair of pointed electrical contacts and maintaining any desired separation distance therebetween from contact to at least one inch of separation.

BRIEF DESCRIPTION OF THE DRAWINGS

The features of the present invention which are believed to be novel are set forth with particularity in the appended claims. The invention, together with further objects and advantages thereof, may best be understood by reference to the following description taken in connection with the accompanying drawings wherein like reference numerals identify like elements throughout and in which:

FIG. 2 is an enlarged side elevational view, with the cable connector leads cut away, of the dual point test probe shown in FIG. 1;

FIG. 3 is a top plan view of the dual point test probe including the coaxial cable extending therefrom and a selectably releasable connector on an opposing end thereof;

FIG. 4 is a front elevational view of the dual point test probe shown in FIG. 3;

FIG. 5 is a rear elevational view of the dual point test probe shown in FIG. 3 with the coaxial cable extending therefrom shown in section; and FIG. 6 is a perspective view of the test instrument connector for the dual point test probe with the coaxial cable cut away therefrom.

DETAILED DESCRIPTION OF THE PREFERRED EMBODIMENT

Figure 1:
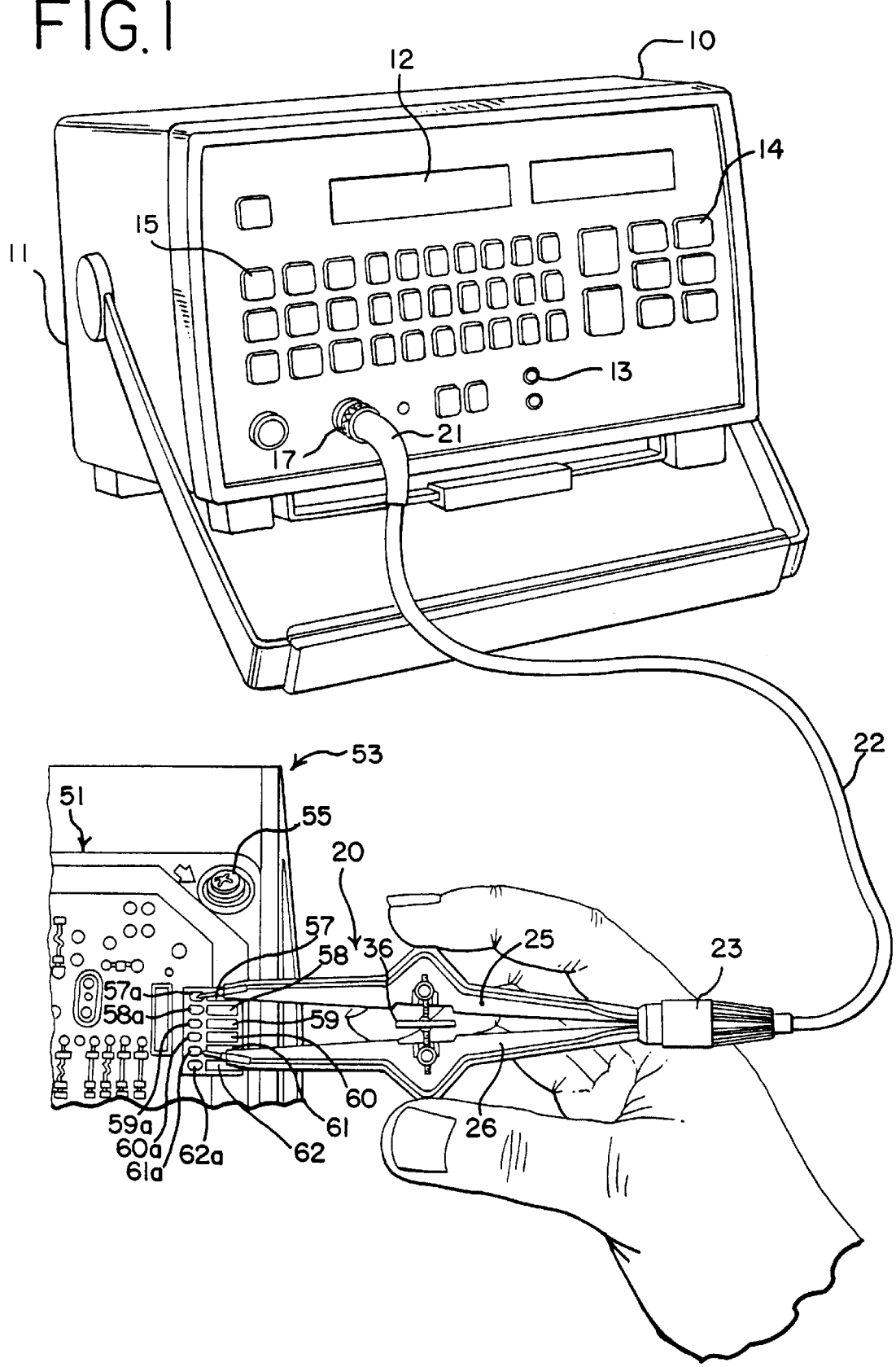
FIG. 1 is a perspective view of a test instrument, including a dual point test probe constructed in accordance with the present invention utilized across surface mount contact pads on a PC circuit board, shown in fragmented perspective.

Referring to FIG. 1, an electronic test instrument, generally indicated at 10, made and sold by the assignee of applicant includes an outer casing 11 having a display or readout 12 therein, indicator lights 13—13, control buttons 14—14 and 15—15 together with a female input jack 17. Such a piece of equipment may be sold under the Sencore trademark as the REZOLVER capacitor-inductor analyzer.

The dual point test probe, generally indicated at 20, includes a quick-connect connector 21 that is selectably releasably mountable upon the female jacks 17—17 of the electronic test equipment 10. Referring to FIGS. 2, 3, 4, 5 and 6, the dual point test probe 20 constructed in accordance with the present invention includes at one distal end a coaxial quick-connect connector 21 attached by a coaxial cable 22 to a flexible rubber joinder, strain relief boot or bight member 23 which has secured in a large open end 24 thereof a pair of opposed elongated insulative generally hollow arm members 25, 26. Midway between the free ends 27, 28 of elongate arm members 25, 26 and the captured ends 29, 30, respectively, are positioned pivotal threaded mountings 33, 34, respectively, into which is fitted a thumb screw, generally indicated at 35, which includes a thumb wheel 36 and reverse threaded studs 37, 38, respectively.

Opposed electrical leads 35a, 36a, respectively, extend from the coaxial cable 22 through the rubber bight member 23, and into the interior hollow recesses of each elongate hollow arm 25, 26 around the pivotal mountings 33, 34 respectively, and to connectors 41, 42 respectively, positioned at the distal free ends of elongate hollow arms 25, 26, respectively. Each connector 41, 42 includes a probe point 43, 44, respectively, mounted thereon that extends forwardly of each distal end 27, 28 of the elongate hollow arm and slightly inwardly to allow the contact points 37, 38, to touch when the thumb wheel 36 is turned to contract the opening between elongate hollow arm member 25 and 26, respectively. While the hollow arm members 25, 26 shown herein are made of translucent plastic such that the leads 35a, 36a appear through the plastic, it will be understood that in a production version of the dual point test probe, it may be desired to color the plastic of the elongate hollow arms in traditionally understood colors, such as red for positive, and black for negative or ground.

Referring to FIGS. 3 and 6, the quick-connect connector 21 has leads from the coaxial cable 22 extending therethrough (not shown) toward the male distal end thereof.

At the free end of the quick connect connector 21, is a shield 45 having cut outs 46, 47 thereon for receiving detents in the hollow female jack 17—17 for providing a selectably releasable connection to the jacks. Radially inside each shield 45 is positioned a central pinpoint electrical connection 48 and a ring electrical connection 49 which are electrically conductively connected to the probe points 43, 44, respectively, through the electrical leads 35a, 36a, making up part of the coaxial cable 22. The inward end 51 of connector 21 is preferably made of the same rubberized material as the bight member 23 so as to provide for an elastic bendable end of the connector 21 allowing for substantial freedom of movement of the dual point test probe 20 without stress hardening the conductors when the connector 21 is mounted in the jack 17 of the electronic test equipment 10.

IN OPERATION

Referring to FIG. 1, a fragment of an electronic component, generally indicated at 53 may be a personal computer chassis or the like having a PC board generally indicated at 51, mounted thereon by phillips screw 55, or the like. PC board 51 includes surface mount components such as connectors 57–62 with their respective solder pads 57a–62a. In order to test electrical conditions between solder pads 57a and 61a, whether continuity, current, voltage drop, capacitance, inductance, or the like, probe point 43 is positioned on solder pad 57a and probe point 44 is positioned on solder pad 61a. Prior to this positioning, the thumb wheel 36 has been rotated to assure that the probe points 43 and 44 are the correct separation (distance) to assure contact with the proper solder pads 57a, 61a, respectively.

It has been noted that in the architecture for integrated circuit boards or PC boards for personal computers, that many of the components are sized, or the solder pads on opposing sides of components are positioned, the same distance apart, providing an architecture such that the separation between the test probe points 43, 44, does not have to be changed for many readings on a single circuit board. As time progresses and miniaturization increases, this separation will probably also decrease. However, that separation may remain substantially the same across the circuit board architecture depending upon the date on which the circuit board was designed.

As can be seen most clearly in FIG. 1, the differential electrical factor between the solder pads 57a and 61a is read by the electronic test instrument 10 by the current flow, voltage drop, or the like extending electrically through points 43 and 44, then through wires 35a, 36a and coaxial cable 22, through connectors 49 and 48 and jack 17 into the electronic test instrument 10 so that such differences or values may be seen on the display 12. The use of the dual point test probe 20 constructed in accordance with the invention as shown most clearly in FIG. 1 allows the single hand of a user to maintain both test points 43, 44, on spaced solder pads 57a, 61a of the PC board 51 of the electronic component 53 such that the opposing hand of the technician may be utilized to perform another operation such as scaling the test instrument 10, changing ranges thereof, etc.

Thus, a new and improved selectably expandable and contractible dual point test probe has been shown and described in connection with making various electronic measurements between solder pads on an integrated circuit board or a personal computer circuit board solely by using a single hand of a technician working on the electronic component.

While a single embodiment of the present invention has been shown and described, it will be understood by those skilled in the art that improvements and modifications may be made within the scope of the invention. Therefore, it is the intent of the appended claims to cover all such changes and modification which fall within the true spirit and scope of the invention.

What is claimed:

1. An adjustable dual point test probe adapted for electrical communication with an electronic test instrument, said test probe comprising:

caliper like body means including a bight portion and a pair of hollow walled elongate arms extending from said bight portion in adjustable relation thereto for providing a pair of adjustably separable distal mountings at free ends of said elongate arms, said bight portion of said caliper like body means is an elastic strain relief boot which covers a distal tip of said elongate arms and further covers said pair of conductors running therethrough, for allowing bending of said elongate arms adjacent said captured ends thereof relative one another and the bending of said pair of conductors without substantial stress hardening of same over time, a pair of pointed electrical contacts, one mounted to extend from each of said free ends of said elongate arms, coaxial cable means including a pair of conductors, one extending through each of said elongate arms in electrically conductive relation with one of said pointed electrical contacts, for extending through said elongate arms and bight portion of said caliper like body means and outwardly thereof terminating in a two wire jack-type connector, and means on said caliper like body means for infinitely adjusting the separation between said pair of pointed electrical contacts and maintaining any desired separation distance therebetween from contact to at least one inch of separation.

2. The adjustable dual point test probe as defined in claim 1 wherein said jack-type connector is a quick connect-disconnect connector.

3. The adjustable dual point test prove as defined in claim 1 wherein, said pair of pointed electrical contacts are mounted on said free ends of said elongate arms at an acute angle thereto to extend not only outwardly to said free ends of said pair of elongate arms but also extend toward each other to provide substantial contact at a distal end of each when said pair of elongate arms are positioned in a closed position.

4. The adjustable dual point test probe as defined in claim 1 wherein, a rear of said jack-type connector is an elastic strain relief boot for allowing bending of said pair of conductors thereon without substantial stress hardening of same over time.

5. The adjustable dual point test probe as defined in claim 1 wherein,
   said means for adjusting and maintaining the separation between said pair of pointed electrical contacts includes,
   a thumb screw including a threaded stud extending through a center of said thumbscrew, said threaded stud having reverse threads on opposing sides of said thumbscrew, and
   a pivotal threaded mounting on each of said pair of elongate arms into which said threaded stud is mounted.

6. The adjustable dual point test probe as defined in claim 1 wherein,
   said caliper like body means includes means for infinitely adjusting the separation of said free ends of said elongate arms.

7. The adjustable dual point test probe as defined in claim 1 wherein,
   the pair of pointed electrical contacts, one extending from the free end of each of said pair of elongate arms,
   said caliper like body means includes means for maintaining a predetermined separation between said free ends of said pair of elongate arms, for providing one-handed manual manipulation of said probe when said pair of pointed electrical contacts touch solder pads or opposing ends of a components on an integrated circuit board.

8. An adjustable dual point test probe suitable for one-handed manual operation for use in connection with electronic test instruments, said test probe comprising:

a pair of elongate arm members made of insulative material each including a captured end, a free end and a hollow walled middle portion, an insulative elastic strain relief boot including a recess at one end thereof into which each of said captured ends of said elongate arm members is retained, an adjustable thumb screw mounting assembly mounted adjacent and between said hollow middle portions of said pair of elongate arm members for providing continuously adjustable and maintained separation of said free ends of said elongate arm members, an electrically conductive point probe positioned to extend from said free end of each of said pair of elongate arm members, each said point probe being positioned to extend forwardly of said free end with a distal tip of each bearing at an acute angle inwardly toward each other to substantially contact when said elongate arm members are contiguously positioned along the respective inside surfaces of each, a pair of conductor means for transmitting electrical signals from said pair of electrically conductive point probes to said electronic test instrument, said pair of conductor means extending through said elongate arm members, said elastic strain relief boot and outwardly thereof, a quick connect electrical connector positioned adjacent a distal free end of said pair of connector means in electrical communication therewith.

* * * * *